(12) United States Patent
Si

(10) Patent No.: US 9,219,495 B2
(45) Date of Patent: Dec. 22, 2015

(54) SIGMA-DELTA ANALOG-TO-DIGITAL CONVERTER

(71) Applicant: MONTAGE TECHNOLOGY (SHANGHAI) CO., LTD., Shanghai (CN)

(72) Inventor: Xiaomin Si, Shanghai (CN)

(73) Assignee: MONTAGE TECHNOLOGY (SHANGHAI) CO., LTD., Shanghai (CN)

(*) Notice: Subject to any disclaimer, the term of this patent is extended or adjusted under 35 U.S.C. 154(b) by 0 days.

(21) Appl. No.: 14/659,639

(22) Filed: Mar. 17, 2015

(65) Prior Publication Data

US 2015/0280734 A1  Oct. 1, 2015

(30) Foreign Application Priority Data

Mar. 28, 2014 (CN) .......................... 2014 1 0124316
Apr. 17, 2014 (CN) .......................... 2014 1 0155996

(51) Int. Cl.
*H03M 3/00* (2006.01)
*H03M 1/00* (2006.01)
*H03M 1/12* (2006.01)
*H04L 25/03* (2006.01)

(52) U.S. Cl.
CPC .............. *H03M 3/464* (2013.01); *H03M 3/322* (2013.01); *H03M 1/00* (2013.01); *H03M 1/12* (2013.01); *H03M 3/30* (2013.01); *H04L 25/03038* (2013.01)

(58) Field of Classification Search
CPC ........... H03M 3/30; H03M 1/12; H03M 1/00; H04L 25/03038
USPC ........... 341/143, 155, 156, 150, 120; 375/252
See application file for complete search history.

(56) References Cited

U.S. PATENT DOCUMENTS

2010/0219998 A1* 9/2010 Oliaei .................... H03M 3/37
341/143

\* cited by examiner

*Primary Examiner* — Joseph Lauture
(74) *Attorney, Agent, or Firm* — Jun He Law Offices P.C.; James J. Zhu

(57) ABSTRACT

The application disclose a sigma-delta analog-to-digital converter. The converter comprises: a summing stage, configured to receive an input signal and subtract a first feedback signal and a second feedback signal from the input signal to generate a difference signal; a loop filter coupled to an output node of the summing stage, and configured to filter the difference signal; a quantizer coupled to an output node of the loop filter, and configured to quantize the filtered difference signal to generate a quantized signal, and to generate an overload signal according to the filtered difference signal, wherein the overload signal indicates whether the filtered difference signal is overloaded and/or an overload amount of the filtered difference signal; a first digital-to-analog converter coupled to the quantizer to receive the quantized signal, and configured to generate the first feedback signal according to the quantized signal; and a second D/A converter coupled to the quantizer to receive the overload signal, and configured to generate the second feedback signal according to the overload signal.

12 Claims, 4 Drawing Sheets

SIGMA-DELTA ANALOG-TO-DIGITAL CONVERTER

TECHNICAL FIELD

The application generally relates to signal processing technology, and more particular to sigma-delta (Σ-Δ) analog-to-digital converters in connection with the use of digital signal processing (DSP) circuits.

BACKGROUND

FIG. 1 illustrates a block diagram of a conventional signal processing system 10. As illustrated in FIG. 1, an input signal is amplified and transmitted to an analog filter 11, and further converted into a digital signal by an A/D converter 13 after being filtered by the analog filter 11. An output node of the A/D converter 13 is coupled to a signal processing circuit having an automatic-gain-control (AGC) circuit 15, a digital filter 17, a carrier synchronizer 19, an equalizer 21 and an error correction/decoding circuit 23, which are coupled in series with each other. For various A/D converters with sigma-delta A/D converters, the signal-to-noise and distortion ratio (SNDR) performance will significantly degrade when the amplitude of the input signal exceeds a full scale of the ADC's input range and results in signal overloading of the converter. The overloading may further incur various problems to the DSP signal processing system 10. For example, when the A/D converter fails due to the input signal overloading, we can see failure of the equalizer 21 or even collapse of the whole DSP circuit's function, which is coupled to the A/D converter's output 13. When the input signal falls back into the full scale range, the DSP circuit has to re-converge again from an initial state, which would take a long time. From a system performance/function point of view, the long recovery is highly undesirable.

However, it happens in many communication systems that the input signals are occasionally overloaded even during its normal operations. For example, the amplitude of an out-of-band signal or interference signal can exceed that of an in-band signal by 20 to 40 dB (these interferences are usually called blockers in Radio Frequency applications). Moreover, the peak to average ratio (PAR) of the real signal may be too high due to modulation, fading or echo of signals. The resulting pulses may cause collapse of the whole signal processing system's function, and this is one of the reasons why inter-leaving/de-interleaving technology is required in many communication systems. The overloading of input signal may also be caused by other factors. In brief, the A/D converters used in the communication systems generally have to process input signals with hugely-varying amplitude that often exceeds its maximum input range.

Some circuits have been developed to deal with the overloading problem. For example, in a typical receiving system, an amplifier, a filter and/or mixer (not shown) may be coupled in front of the A/D converter 13 as illustrated in FIG. 1, and digital signal processing circuits may be coupled to the output. To deal with signal amplitude variations, the front-stage amplifier may be an AGC amplifier. The amplitude or power of the input signal can be adjusted by controlling the gain of the AGC amplifier. Accordingly, the amplitude of the input signal may be adjusted to a range that can be properly processed by the A/D converter. However, assuming that the input signal has a PAR value of 20 dB, the SNR needed at the output node of the A/D converter is greater than 30 dB, and the blocker is of 30 dB or higher, then the AGC level can be set to be 50 dB lower than a maximum value of the SNDR of the A/D converter. Thus, it is required to use an A/D converter with a SNDR value higher than 80 dB. However, the circuit schematic of high-performance (SNDR>80 dB) high-frequency (10 MHz or higher) A/D converters are very complicated, if feasible at all. Such high-performance A/D converters are sensitive to parasite effects or to the environment (i.e. the interferences produced by the peripheral circuit components on the same chip), and therefore the high-performance A/D converters may not be integrated within a system on chip (http://www.stanford.edu/~murmann/adcsurvey.html).

Another conventional solution to the overloading problem is using several A/D converters in parallel in a system. Moreover, a detection circuit is also included to detect the occurrence of overloading. When the overloading is detected, one or more of the A/D converters may be chosen to process the overloaded input signal. In contrast, some other A/D converter(s) may be chosen when no overloading is detected. However, the switching of the A/D converters may disrupt the signal conversion and bring unwanted long latency.

Furthermore, to deal with the impulsive interferences, which often cause overloading of the data converters, inter-leaver and de-interleaver circuits are defined in the communication channel protocol used in many communication systems to spread out the impulsive noises introduced by the communication channel in time or frequency domains. However, these circuits have to be defined at the communication system level and be implemented in both the transmitter and receiver. The larger the interleaver and de-interleaver are, the more memory space is needed.

For high bandwidth A/D converters with very high SNDR requirements, continuous-time sigma-delta analog-to-digital conversion circuits are becoming more and more important. In wireless communication systems such as the GSM or WCDMA system, the continuous-time sigma-delta A/D conversion circuit has already become a critical component. A typical continuous-time sigma-delta A/D conversion circuit usually includes a continuous-time filter, a quantizer, a feedback DAC and summation circuits.

Feedback digital-to-analog (D/A) converter(s) is used in the sigma-delta A/D converters to feed back a quantized signal output by a quantizer to a summing stage at the most front stage of the sigma-delta A/D converter. The feedback D/A converter usually determines the resolution of the whole sigma-delta A/D converter, especially for the high resolution continuous-time sigma-delta A/D converters. In particular, the linearity of the feedback D/A converters determines the resolution of the whole ADC. Thus, many methods have been developed to improve the linearity of the D/A converters. For example, some use Dynamic Element Matching (DEM) or similar signal processing techniques. The DEM swaps the DAC's unit elements so they are randomly picked to contribute to the output. The DEM or similar techniques move the quantization noise to a higher frequency, which can be subsequently filtered by the loop filter. The linearity of DAC is positively dependent on the number of bits it has, which means that a DAC with higher linearity requires more bits. However, the more bits a DAC has, the more latency the DEM will cause, which limits the maximum operating frequency of the DAC and thus limits the over sampling ratio (OSR) of the delta sigma converter. Thus, there is a trade off between the DAC linearity and the clock frequency at which the DAC operates). Some converters use a switch capacitor return to zero (SCRZ) structure (Timir Nandi, "*Continuous-Time ΔΣ Modulators with Improved Linearity and Reduced Clock Jitter Sensitivity Using the Switched-Capacitor Return-to-Zero DAC*", IEEE JSSC Vol. 48, No. 8, August 2013); and some converters use a filter to estimate the error of the feedback D/A converter more accurately (Pascal Witte, "*Hardware Complexity of a Correlation Based Background DAC Error Estimation Technique for Σ-Δ ADCs*", 2167-2170, *Circuits and Systems (ISCAS), Proceedings of* 2010 *IEEE International Symposium on*). However, these sigma-delta converters are complicated in structure and sensitive to the parasite effect and interferences from the environment, and thus are difficult for implementation. In the following, we classify DACs into two types: a high linearity type that utilizes various linearization techniques such as DEM or filter, as given above, and a regular type which only relies on intrinsic device matching to achieve its linearity. The high linearity ones are often associated with additional latency introduced by the linearization techniques.

Thus, there is a need for sigma-delta A/D converters capable of processing input signals with hugely-varying amplitude while not requiring an improved linearity of the feedback D/A converters.

SUMMARY

An objective of the application is to provide an A/D converter capable of achieving the same level of system performance with a simpler circuit structure and faster response, or better performance and faster response at the similar level of circuit complexity.

In an aspect of the application, there is provided a sigma-delta A/D converter. The converter comprises: a summing stage, configured to receive an input signal and subtract a first feedback signal and a second feedback signal from the input signal to generate a difference signal; a loop filter coupled to an output node of the summing stage, and configured to filter the difference signal; a quantizer coupled to an output node of the loop filter, and configured to quantize the filtered difference signal to generate a quantized signal, and to generate an overload signal according to the filtered difference signal, wherein the overload signal indicates whether the filtered difference signal is overloaded and/or an overload amount of the filtered difference signal; a first digital-to-analog (D/A) converter coupled to the quantizer to receive the quantized signal, and configured to generate the first feedback signal according to the quantized signal; and a second D/A converter coupled to the quantizer to receive the overload signal, and configured to generate the second feedback signal according to the overload signal.

In certain embodiments, the quantizer has a first output node for outputting the quantized signal, and a second output node for outputting the overload signal.

In certain embodiments, the quantizer is further configured to compare the filtered difference signal and a predefined overload threshold, and generate the overload signal according to the comparison result of the filtered difference signal and the predefined overload threshold.

In certain embodiments, the sigma-delta A/D converter further comprises: a signal processing module, coupled between the quantizer and the first D/A converter, and configured to improve the linearity of the first feedback signal output by the first D/A converter.

In certain embodiments, the signal processing module comprises a dynamic element matching module configured to transfer a mismatch in the quantized signal out of a passband of the loop filter.

In certain embodiments, the signal processing module comprises a compensation module for compensating an excess loop delay in the sigma-delta A/D converter.

In certain embodiments, the second D/A converter has linearity lower than that of the first D/A converter, thus much lower latency than the first D/A converter In certain embodiments, the second D/A converter is a multi-level D/A converter.

In certain embodiments, the loop filter comprises cascaded integrators with feedback.

In certain embodiments, the loop filter is a resistor-inductor-capacitor network filter.

In certain embodiments, the sigma-delta A/D converter further comprises: a third D/A converter coupled to the quantizer to receive the quantized signal, and configured to generate a third feedback signal according to the quantized signal, and output the third feedback signal to an output node or an intermediate node of the loop filter.

In certain embodiments, the sigma-delta A/D converter is a continuous-time sigma-delta A/D converter.

The foregoing and other advantages and features of the application, and the manner in which the same are accomplished, will become more readily apparent upon consideration of the following detailed description of the application taken in conjunction with the accompanying examples, which illustrate preferred and exemplary embodiments.

BRIEF DESCRIPTION OF THE DRAWINGS

The aforementioned features and other features of the application will be further described in the following paragraphs by referring to the accompanying drawings and the appended claims. It will be understood that, these accompanying drawing merely illustrate some embodiments in accordance with the present application and should not be considered as limitation to the scope of the present application. Unless otherwise specified, the accompanying drawings need not be proportional, and similar reference characters generally denote similar elements.

DETAILED DESCRIPTION OF THE PREFERRED EMBODIMENTS

The following detailed description refers to the accompanying drawings as a part of the present application. The illustrative embodiments described in the detailed description, the accompanying drawings and the claims are not limiting, and other embodiments may be adopted, or modifications may be made without deviating from the spirit and subject of the application. It should be understood that, the various aspects of the application described and graphically presented herein may be arranged, replaced, combined, divided and designed in many different configurations, and these different configurations are implicitly included in the application.

Figure 1:
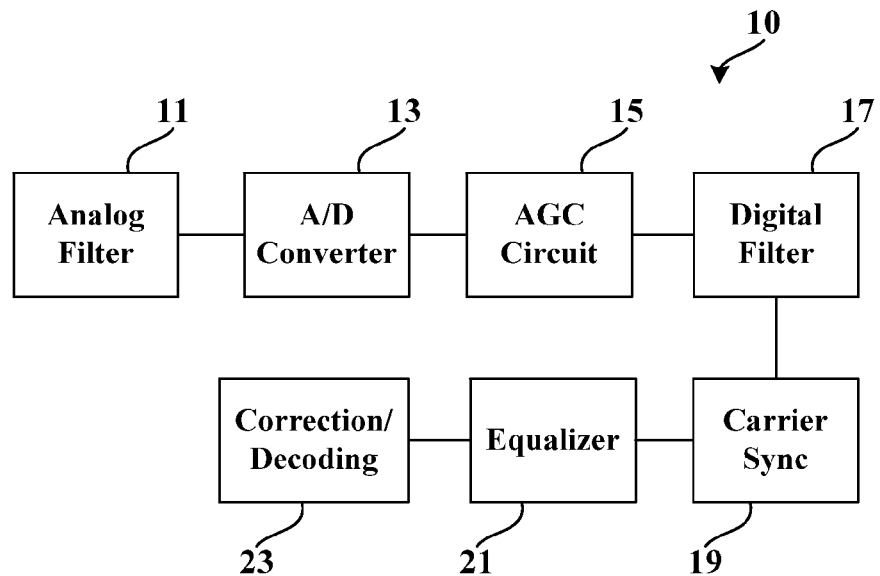
FIG. 1 illustrates a block diagram of a conventional signal processing system 10.

The inventor of the application has found that the modules of the signal processing system 10 in FIG. 1 have different requirements on the input signal's signal-to-noise ratio (SNR). Many modules for maintaining the basic operation of the signal processing system 10, e.g. the AGC circuit 15 and the carrier synchronizer 19, require a SNR threshold lower than the SNR threshold required for maintaining the normal operation of the whole system 10. Moreover, the initialization or setup of some modules such as the equalizer 21 takes a long time to converge. Thus, there is a need for an A/D converter which is capable of providing the SNDR required by those modules for maintaining the basic operation of the system (e.g. the AGC circuit and the carrier synchronizer) so that the system can recover from the failure due to the input signal with big impulsive noise as soon as possible.

The inventor also found that one of the major speed limits to high SNDR continuous-time (CT) delta-sigma ADC circuit is due to the DEM or other linearization techniques applied at the feedback DAC's input digital signals. Compared with the regular type DACs with relatively low linearity, the high linearity ones are almost always associated with additional latency. This additional latency adversely affects the converter's overall speed.

In view of the aforementioned findings, the inventor has designed a sigma-delta A/D converter using two or more types of D/A converters in its feedback loop. At least one of the two or more types of D/A converters may respond to an overload signal indicative of overloading of an input signal of the sigma-delta A/D converter. Without substantially increasing the complexity and/or the latency of the circuit structure (e.g. pushing the linearity of D/A converters to technology limit using extra digital linearization techniques), the sigma-delta A/D converter of the application can respond to larger input pluses or peaks and/or recover from an unstable state caused by such input peaks much faster than conventional sigma-delta A/D converters that use a single highly linear type of D/A converter that feeds back to the input stage of the A/D converter, thereby improving the system performance. Furthermore, the sigma-delta A/D converter of the application may use a type of D/A converter with a relative lower linearity to respond to the overloading of the input signal, thereby either omitting the requirement of using the type of D/A converters with very good linearity, or lowering the linearity requirement for the DAC with the highest linearity in the whole converter. In another word, compared with the conventional sigma-delta A/D converters, the sigma-delta A/D converter of the application can achieve the same or similar system performance (or faster response) with a simpler circuit structure (e.g. using a type of D/A converter(s) with much lower linearity). Still further, the feedback signals of the two or more types of D/A converters can be directly summed at the input stage of the A/D converter, which differs from the conventional sigma-delta A/D converter circuits. The aforementioned and other advantages and features of the application will be further described with reference to the following specific embodiments of the application.

Figure 2:
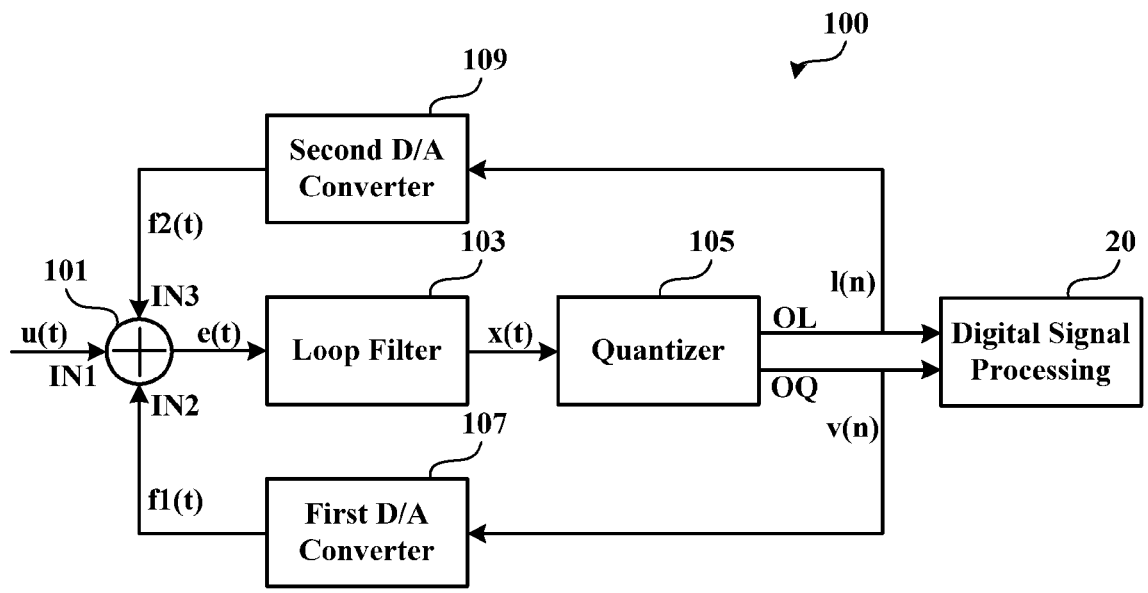
FIG. 2 illustrates a sigma-delta A/D converter 100 according to an embodiment of the application.

FIG. 2 illustrates a sigma-delta A/D converter 100 according to an embodiment of the application. In certain embodiments, the sigma-delta A/D converter 100 is used to convert an analog input signal u(t) to a digital quantized signal v(n), and output the digital quantized signal v(n) at its output node for use in a post-stage digital signal processing circuit 20.

As illustrated in FIG. 2, the sigma-delta A/D converter 100 includes:

a summing stage 101 configured to receive the input signal u(t) and subtract a first feedback signal $f_1(t)$ and a second feedback signal $f_2(t)$ from the input signal u(t) to generate a difference signal e(t);

a loop filter 103 coupled to an output node of the summing stage 101, and configured to filter the difference signal e(t) to generate a filtered difference signal x(t);

a quantizer 105 coupled to an output node of the loop filter 103, and configured to quantize the filtered difference signal x(t) to generate the quantized signal v(n), and to generate an overload signal 1(n) according to the filtered difference signal x(t), wherein the overload signal 1(n) indicates whether the filtered difference signal x(t) is overloaded and/or an overload amount of the filtered difference signal x(t);

a first D/A converter 107 coupled to the quantizer 105 to receive the quantized signal v(n), and configured to generate the first feedback signal $f_1(t)$ according to the quantized signal v(n); and a second D/A converter 109 coupled to the quantizer 105 to receive the overload signal 1(n), and configured to generate the second feedback signal $f_2(t)$ according to the overload signal 1(n).

The term "overload" or "overloading" in the application refers to a situation that the amplitude of a signal exceeds a predefined threshold. The predefined threshold may be configured based on actual applications. For the quantizer 105, the predefined threshold for defining overload is within a full-scale input of the quantizer 105. The full-scale input of the quantizer is a difference between a maximum value and a minimum value of the quantifiable scope of the quantizer. When the amplitude of the input signal of the quantizer exceeds the full-scale input, the output of the quantizer does not vary with the input signal of the quantizer. Where the predefined threshold is within the full-scale input, the quantizer 105 may output the overload signal 1(n) with a value corresponding to the amplitude of the input signal of the quantizer 105 if the amplitude of the input signal of the quantizer 105 exceeds the predefined threshold but is still within the full-scale input. Thus, the value of the overload 1(n) may indicate the amount of overload of the signal provided to the quantizer 105 in this situation.

An example is presented herein for reference. Assume that the output of the quantizer 105 is encoded in a 9-bit thermometer code, and the quantifiable scale, i.e. the full-scale input, of the quantizer 105 is from −5V to 5V. As an example, the input-output relationship for the quantizer 105 is illustrated in Table 1 below.

TABLE 1

| Input (V) | Output |
|---|---|
| <−5 | 000000000 |
| −5~−3.75 | 100000000 |
| −3.75~−2.5 | 110000000 |
| −2.5~−1.25 | 111000000 |
| −1.25~0 | 111100000 |
| 0~1.25 | 111110000 |
| 1.25~2.5 | 111111000 |
| 2.5~3.75 | 111111100 |
| 3.75~5 | 111111110 |
| >5 | 111111111 |

Furthermore, the predefined threshold indicating overload is set to be 3.75V (−3.75V). Thus, the output of the quantizer 105 varies within [110000000, 111111100] if the signal input to the quantizer 105 is within [−3.75V, 3.75V]. And the output of the quantizer 105 may be "000000000", "100000000", "111111110" or "111111111" if the signal input to the quantizer 105 is higher than 3.75V or lower than −3.75V, which indicates the overload of the signal input to the quantizer 105. For example, the output value of "000000000" indicates the input lower than −5V while the output value of "100000000" indicates that the input is within (−5V, −3.75V], thus, these two output values indicate different amounts of overload of the signal input to the quantizer 105.

In certain embodiments, the quantizer 105 has a first output node $O_Q$ and a second output node $O_L$. The quantizer 105 outputs the quantized signal v(n) at the first output node $O_Q$, and outputs the overload signal 1(n) at the second output node $O_L$. Accordingly, the first D/A converter 107 is coupled to the first output node $O_Q$ to receive the quantized signal v(n), and the second D/A converter 109 is coupled to the second output node $O_L$ to receive the overload signal 1(n).

In certain embodiments, the summing stage 101 has three input nodes including a first input node $IN_1$, a second input node $IN_2$ and a third input node $IN_3$ to receive the external input signal u(t) to be converted, the internal first feedback signal $f_1(t)$ and the internal second feedback signal $f_2(t)$, respectively. The summing stage 101 subtracts the first feedback signal $f_1(t)$ and the second feedback signal $f_2(t)$ from the input signal u(t) to generate the difference signal e(t) at its output node.

An input node of the loop filter 103 is coupled to the output node of the summing stage 101 to receive the difference signal e(t). The loop filter 103 may be designed according to the noise transfer function required by the sigma-delta A/D converter 100, and implemented with operational amplifiers and a resistor-capacitor network. For example, the loop filter 103 may have one or more integrators to provide corresponding first-order or n-order filtering process. For example, the loop filter 103 may be a transconductance-capacitor (Gm-C) filter, or a resistor-inductor-capacitor filter. In certain embodiments, the loop filter 103 may be a low-pass filter or a band-pass filter capable of filtering high frequency noises or out-of-band noises in the difference signal e(t).

The quantizer 105 is mainly used to convert the analog filtered difference signal x(t) to the digital quantized signal v(n). In certain embodiments, the quantizer 105 may be of a flash type, which has a comparison circuit and/or a processing circuit. The comparison circuit is used to compare the filtered difference signal x(t) with a predetermined number of reference electrical parameters (such as voltage, current or charge, depending on the form of the difference signal x(t)) to obtain a corresponding number of comparison results. Each of the comparison results is of a first logic value or a second logic value. The number of comparison results indicate the amplitude of the filtered difference signal x(t) with reference to the predetermined number of reference electrical parameters, thereby converting the analog filtered difference signal x(t) to the discrete digital signal compatible with the post-stage digital signal processing circuit 20. In certain embodiments such as a flash type of quantizer, the comparison circuit may provide the predetermined amount of comparison results to the processing circuit. The number of the reference electrical parameters determines the resolution of quantization. In certain embodiments, the quantizer 105 may have a quantization resolution of 5-level, 9-level or higher.

The quantizer 105 is also used to compare the filtered difference signal x(t) with a predetermined overload threshold, and to generate the overload signal 1(n) according to the comparison result. If the filtered difference signal x(t) exceeds the predetermined overload threshold, the overload signal may indicate the overloading the of the filtered difference signal x(t). For example, the quantizer 105 may output the overload signal 1(n) of the first logic value at the second output node $O_L$ if the filtered difference signal x(t) is overloaded; and the quantizer 105 may output the overload signal 1(n) of the second logic value at the second output node $O_L$ if the filtered difference signal x(t) is not overloaded, wherein the second logic value is contrary to the first logic value. In other words, the overload signal 1(n) of the first logic value indicates that the filtered difference signal x(t) is overloaded.

In certain embodiments, the quantizer 105 may have a multi-bit output node capable of indicating the amount of overload of the filtered difference signal x(t). It is readily appreciated that the output of the comparison circuit may directly indicate whether the filtered difference signal x(t) is overloaded and/or the amount of overload, without using any additional processing circuit. Optionally, the overload signal 1(n) may be processed by certain logic circuit to improve the reliability of the determination of overload.

The first output node $O_Q$ and the second output node $O_L$ of the quantizer 105 are coupled to a first D/A converter 107 that is of a first type(e.g. the type of D/A converters with very good linearity such as 14-bit), and the second D/A converter 109 that is of a second type (e.g. a regular type of D/A converter such as 9-bit), respectively. Then the two D/A converters 107 and 109 generate the first feedback signal $f_1(t)$ and the second feedback signal $f_2(t)$, respectively. Preferably, the first D/A converter 107 of the first type may have a linearity higher than that of the second D/A converter 109 of the second type. For example, the linearity of the first D/A converter 107 is 14-bit, and the linearity of the second D/A converter 109 is 9-bit. The intrinsic linearity of the first and second D/A converters (that is before any calibration or DEM) can be represented by the conversion error between the adjacent levels of the D/A converters. For example, the D/A converters may convert a digital signal to an analog signal according to Table 2.

TABLE 2

| input digital signal | output analog signal |
|---|---|
| 00 | 0 V |
| 01 | 0.39 V |
| 10 | 0.79 V |
| 11 | 1.2 V |

As can be seen from Table 2, the output analog signal ranges from 0V to 1.2V, which corresponds to 4 levels with an average difference of 0.4V. However, the actual output signal may have an error of 0.01V, which reflects the linearity of the D/A converter.

In certain embodiments, the first D/A converter 107 is a current-type D/A converter. The current-type D/A converter may be a current mirror having multiple mirror current paths. Each of the mirror current paths may generate a mirror current from a reference current at a predetermined ratio. The current-type D/A converter may adjust the amplitude of an output current by turning on or off one or more of the mirror current paths, and the output current is the sum of the mirror currents. In certain embodiments, the first D/A converter 107 may be a switch-capacitor resistor (SCR) D/A converter such as a half-return-to-zero (HRZ) SCR D/A converter.

In certain embodiments, the quantized signal v(n) output by the quantizer 105 may be signal processed and then sent to the first D/A converter 107. The signal processing is used to improve the linearity of the output signal of the first D/A converter 107. The signal processing may include dynamic element matching (DEM) and/or excess loop delay (ELD) compensation. For example, the sigma-delta A/D converter 100 may have a DEM module (not shown) coupled between the first output node $O_Q$ of the quantizer 105 and the input node of the first D/A converter 107, and be used to transfer a mismatch in the quantized signal v(n) out of a passband of the loop filter 103. Furthermore, the DEM processing may balance the use of D/A conversion units of the first D/A converter 107. In this way, the high-frequency mismatch in the first feedback signal $f_1(t)$ generated from the quantized signal v(n) may be filtered by the loop filter 103. Moreover, the sigma-delta A/D converter 100 may include a compensation module for compensating the excess loop delay in the loop, which is coupled between the first output node $O_Q$ of the quantizer 105 and the input node of the first D/A converter 107. It is readily appreciated that the DEM module and/or the ELD compensation module may be implemented with any suitable circuitry and applied in the sigma-delta A/D converter 100 according to the embodiments of the application.

The second D/A converter 109 is used to generate the second feedback signal $f_2(t)$ according to the overload signal $1(n)$. For example, assume that the second D/A converter 109 is a 1-bit D/A converter, which may output an analog signal of a zero value or a non-zero value (in voltage, current or charge form). The output analog signal of the non-zero value may be of a predetermined reference electrical parameter (reference voltage, reference current or reference charge). For example, when the overload signal $1(n)$ is of the second logic value, the second feedback signal $f_2(t)$ is of the zero value. The second feedback signal $f_2(t)$ may not affect the difference signal $e(t)$ and then the difference signal $e(t)$ has an amplitude equal to the difference between the input signal $u(t)$ and the first feedback signal $f_1(t)$. However, when the overload signal $1(n)$ is of the first logic value, the second feedback back signal $f_2(t)$ is of the non-zero value. Then the difference signal $e(t)$ has an amplitude equal to the difference between the input signal $u(t)$ and the sum of the first and second feedback signals. In other words, the input signal $u(t)$ is subtracted with the first feedback signal $f_1(t)$ and the predetermined reference electrical parameter of the second feedback signal $f_2(t)$, thereby producing the difference signal $e(t)$ with a smaller amplitude. It is readily appreciated that when the overload signal $1(n)$ is the multi-bit date indicative of the amount of overload, the second D/A converter 109 may generate the second feedback signal $f_2(t)$ of different amplitudes according to the value of the overload signal $1(n)$. For example, the amplitude of the second feedback signal $f_2(t)$ increases with the amount of overload of the filtered difference signal $x(t)$ so that the input signal $u(t)$ is at least partially compensated or restricted.

From the foregoing, for the sigma-delta A/D converter 100 in accordance with the embodiments of the application, when the input signal $u(t)$ is too big so that the filtered difference signal $x(t)$ is overloaded, the quantizer 105 may generate the overload signal $1(n)$ of the first logic value. Accordingly, the difference signal $e(t)$ may be quickly decreased within the quantifiable scope of the quantizer 105 by subtracting the input signal $u(t)$ by the additional predetermined reference electrical parameter. The quantizer 105, the first D/A converter 107 and the second D/A converter 109 can further perform the A/D conversion according to the decreased difference signal $e(t)$. The linearity of the D/A converters affects the latency. As the second D/A converter 109 for providing the predetermined reference electrical parameter is not required to have a high linearity, the second D/A converter 109 with a linearity lower than that of the first D/A converter 107 can be used in the sigma-delta A/D converter 100. Thus, the loop delay of the sigma-delta A/D converter 100 can be decreased, thereby improving the signal processing speed of the sigma-delta A/D converter 100.

As illustrated in FIG. 2, the resolution of signal conversion of the sigma-delta A/D converter 100 still depends on the first D/A converter 107 if the output of the second D/A converter 109 is zero, while the first D/A converter 107 may have a relatively high linearity to assure a sufficient resolution of signal conversion of the sigma-delta A/D converter 100. Furthermore, the resolution of signal conversion of the sigma-delta A/D converter 100 depends on the second D/A converter 109 if the output of the second D/A converter 109 is not zero.

It should be noted that two feedback D/A converters including the first and second D/A converters are adopted in the sigma-delta A/D converter according to embodiments of the application. In some other embodiments, one or more feedback D/A converters may be used in the sigma-delta A/D converter, or particularly between the quantizer and the summing stage. These feedback D/A converters may generate feedback signals according to the overload signal or the quantized signal.

The sigma-delta A/D converter requires a lower peak SNDR compared with the conventional sigma-delta A/D converters, thereby lowering its sensitivity to the parasite effect and the environmental interferences. Thus, in certain embodiments, the sigma-delta A/D converter may be integrated within a system on chip, for example, integrated in a chip with the digital signal processing circuit 20.

Figure 3:
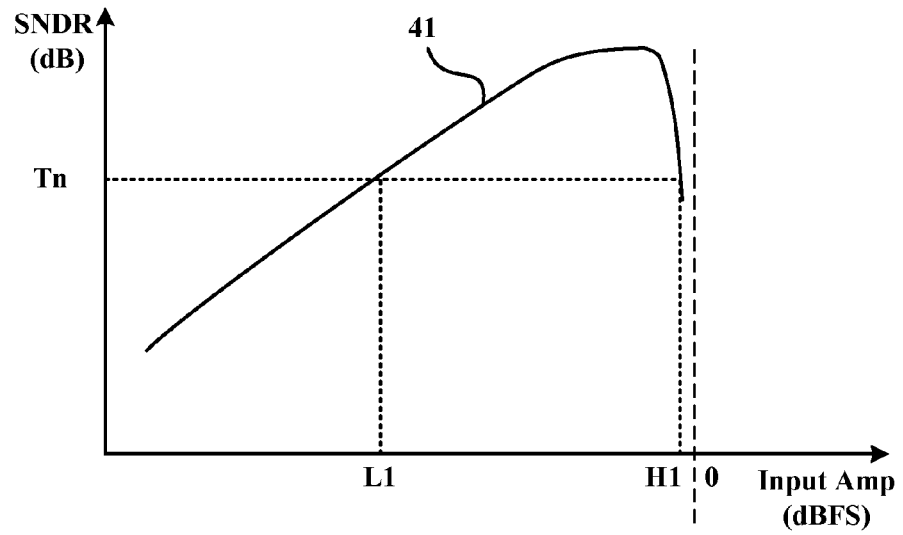
FIG. 3 illustrates the SNDR vs. input signal curve for conventional sigma-delta A/D converters.

FIG. 3 illustrates the SNDR vs. input signal curve for conventional sigma-delta A/D converters. As illustrated in FIG. 3, the horizontal axis (the amplitude of the input signal) denotes the amplitude ratio of the input signal of the sigma-delta A/D converter to the overload threshold of the quantizer. The amplitude of the input signal is equal to the overload threshold at point 0 dBFS. Curve 41 shows that the SNDR value of the conventional sigma-delta A/D converters varies with the amplitude of the input signal.

As can be seen from FIG. 3, the SNDR value for the conventional sigma-delta A/D converters increases with the amplitude of the input signal, and drops dramatically when being close to the overload threshold. In the event that the SNDR threshold $T_n$ required for the basic operation of the system is satisfied, the conventional sigma-delta A/D converter can operate normally if the amplitude of the input signal is within (L1, H1). H1 is close to but slightly lower than the overload threshold. When the amplitude of the input signal is out of (L1, H1), the input signal to the conventional sigma-delta A/D converter is overloaded, thereby causing failure of the A/D converter.

Figure 4:
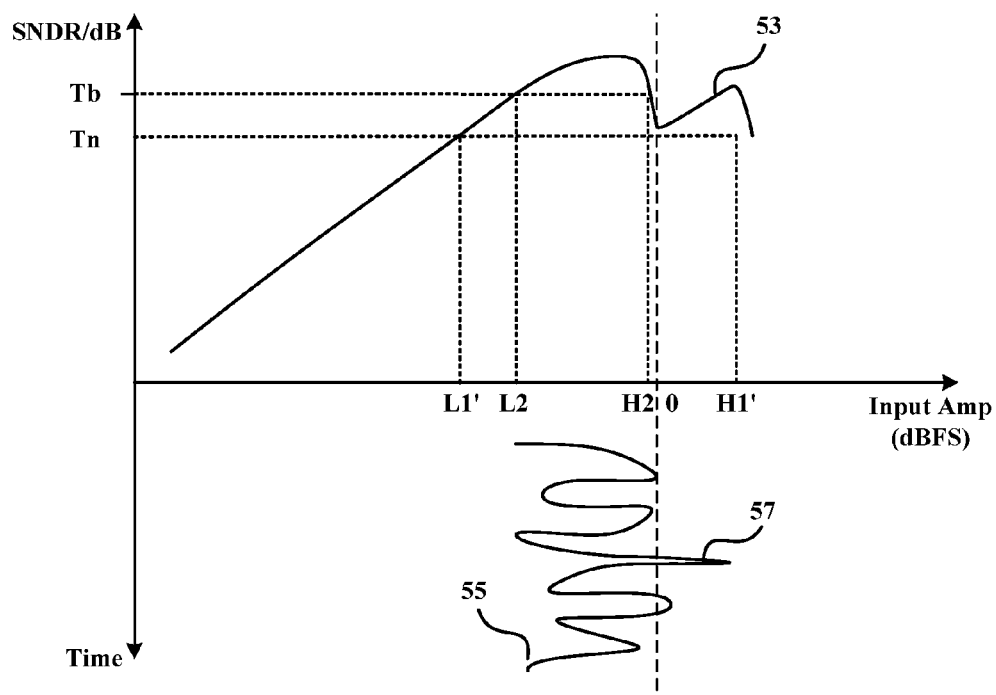
FIG. 4 illustrates the SNDR vs. input signal curve for the sigma-delta A/D converter 100 in FIG. 2.

FIG. 4 illustrates the SNDR vs. input signal curve for the sigma-delta A/D converter 100 in FIG. 2.

As illustrated in FIG. 4, the horizontal axis (the amplitude of the input signal) denotes the amplitude ratio of the input signal of the sigma-delta A/D converter 100 to the overload threshold of the quantizer 105. The amplitude of the input signal is equal to the overload threshold at point 0 dBFS. The upper portion of the vertical axis denotes the SNDR value of the sigma-delta A/D converter 100, and the lower portion of the vertical axis denotes time. Curve 53 shows that the SNDR value of the sigma-delta A/D converter 100 varies with the amplitude of the input signal, while curve 55 shows the evolution of the input signal with time.

According to the curve 53 associated with the sigma-delta D/A converter 100, when the input signal is not overloaded, the operation of the sigma-delta A/D converter 100 is similar to the operation of the conventional sigma-delta A/D converter. In other words, the SNDR value of the sigma-delta A/D converter 100 increases with the amplitude of the input signal, and reaches its maximum when the amplitude of the input signal is close to the overload threshold. However, when the input signal is overloaded (i.e. when overload pulses 57 occur in the curve 55), due to the feedback of the second D/A converter, the sigma-delta A/D converter 100 of the application can subtract a reference electrical parameter from the input signal quickly to decrease the amplitude of the signal at the input node of the quantizer within its normal operational scope (i.e. the quantifiable scope). In this way, the sigma-delta A/D converter 100 of the application can work normally with appropriate SNDR performance even if the input signal is overloaded. As previously mentioned, when the amplitude of the input signal exceeds the overload threshold, the resolution of A/D conversion and the SNDR performance (including the peak SNDR) of the sigma-delta A/D converter 100 of the application depends on the second D/A converter.

From the foregoing, when the amplitude of the input signal is within (L1', H1'), the SNDR value of the sigma-delta A/D converter 100 is maintained above a threshold value Tn required for the basic operation of the system. Therefore, the system can recovery to its normal operation as soon as the pulsed input signal (e.g. pluses 57) occurs, such that the impact of the pulsed input signal to the operation of the system is reduced. Moreover, when the amplitude of the input signal is within (L2, H2), the SNDR value of the sigma-delta A/D converter 100 is maintained above a threshold value Tb required for the normal operation of the system. Therefore, the post-stage signal processing circuits or systems of the sigma-delta A/D converter 100 can work normally. As shown in FIG. 4, (L2, H2) is within (L1', H1').

Also can be seen from the foregoing, when the SNDR value required by the post-stage circuits or systems of the sigma-delta A/D converter 100 is bigger than Tn, the amplitude scope of the input signal that can be normally processed by the sigma-delta A/D converter 100 expands from (L1, H1) in FIG. 3 to (L1', H1') in FIG. 4, wherein H1' is higher than H1. Moreover, if the SNDR value required for the basic operation of the circuits or systems is bigger than $T_n$ and the SNDR value required for the normal operation of the circuits or system is bigger than $T_b$ ($T_b>T_n$), the sigma-delta A/D converter 100 can respond to input pluses more quickly. In other words, the circuits or system with the sigma-delta A/D converter 100 can recover from an unstable state more quickly when the big input pluses occur in the input signal.

Figure 5:
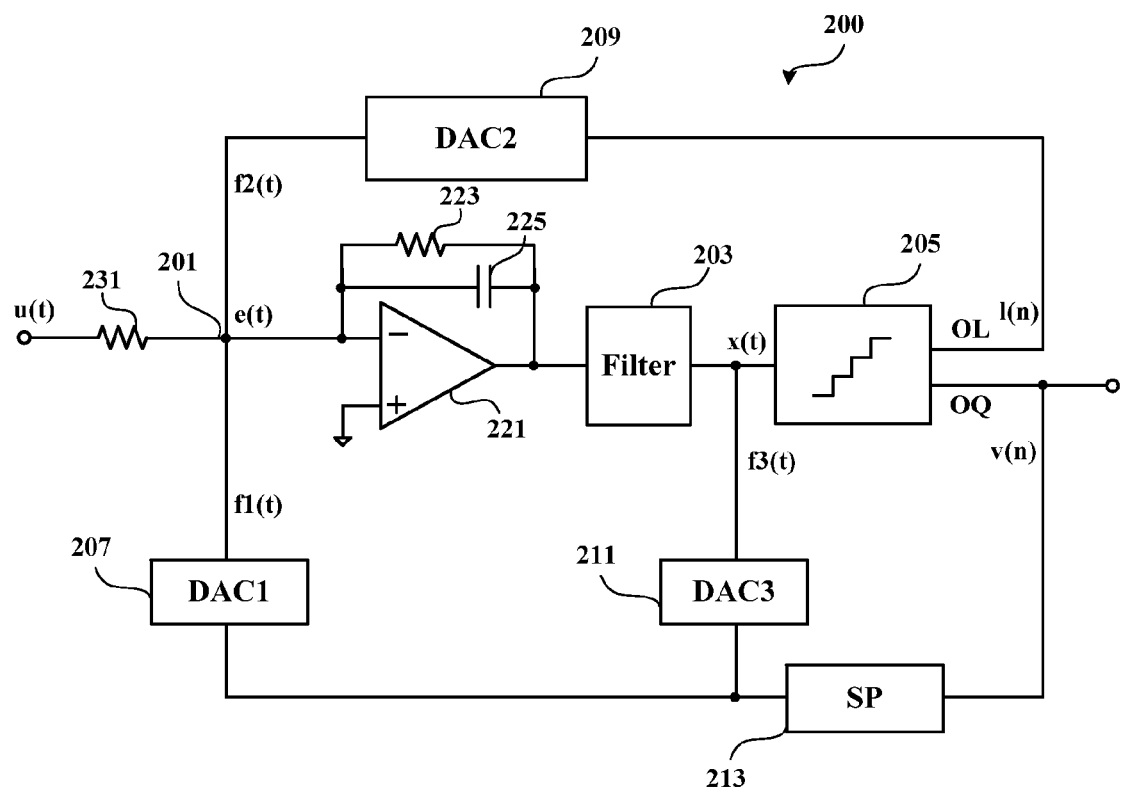
FIG. 5 illustrates a sigma-delta A/D converter 200 according to another embodiment of the application.

FIG. 5 illustrates a sigma-delta A/D converter 200 according to another embodiment of the application.

As illustrated in FIG. 5, the sigma-delta A/D converter 200 includes: a summing stage 201, a loop filter 203, a quantizer 205, a first D/A converter 207, a second D/A converter 209, a third D/A converter 211 and a signal processing module 213. The first D/A converter 207, the second D/A converter 209 and the third D/A converter 211 are all current-type D/A converters.

In the embodiment shown in FIG. 5, the summing stage 201 is a current-type summing stage. An input signal u(t) input at an input node is converted to an input current via an input resistor 231. The first D/A converter 207 provides a first feedback signal $f_1(t)$ and the second D/A converter 209 provides a second feedback signal $f_2(t)$, both of which are of a direction opposite to the direction of the input current. These three currents are summed at the summing stage 201, i.e. a difference current e(t) is generated by subtracting the input current u(t) by the feedback currents $f_1(t)$ and $f_2(t)$. The summing stage 201 is implemented based on an operational amplifier 221. A non-inverting input node of the operational amplifier 221 is grounded while an inverting input node of the operational amplifier 221 is coupled to the summing stage 201. A first capacitor 225 and a first resistor 223 is parallel coupled between the inverting input node and an output node of the operational amplifier 221, which constitute a feedback path of the operational amplifier 221. The operational amplifier 221 may provide a difference signal at its output node. It is appreciated that the summing stage may be implemented with other circuitries. For example, the summing stage may be an operational amplifier-based adder circuit, which can sum the input signal u(t) and the feedback signals $f_1(t)$ and $f_2(t)$ in voltage form or charge form. The output node of the operational amplifier 221 may be further coupled to a loop filter 203 to filter the difference signal. The loop filter 203 may be designed according to the noise transfer function required by the sigma-delta A/D converter 200, and implemented with operational amplifiers and a resistor-capacitor network, which will be elaborated herein. An output node of the loop filter 203 is coupled to an input node of the quantizer 205.

Compared with the sigma-delta A/D converter 100 shown in FIG. 2, the third D/A converter 211 is further provided and coupled to the loop filter 203. The third D/A converter 211 is coupled to a first output node of the quantizer 205, at which a quantized signal v(n) is output, to receive the quantized signal v(n) and to generate a third feedback signal $f_3(t)$ according to the quantized signal v(n). The third feedback signal $f_3(t)$ is output to the output node of the loop filter 203 and to the input node of the quantizer 205. The third feedback signal $f_3(t)$ is summed with the filtered difference signal x(t) and then sent to the quantizer 205. The third D/A converter 211 provides an additional signal feedback path from the quantizer 205 to the loop filter 203. In certain embodiments, the third D/A converter 211 may have a linearity substantially equal to that of the first D/A converter 207, both of which are of the first, high linearity type but different from that of the second D/A converter 209. That is to say, the linearity of the third D/A converter 211 may be better than that of the second D/A converter 209, but equal to or worse than that of the first D/A converter 207. As previously described, in certain embodiments, a signal processing module 213 may be coupled between the first D/A converter 207 and the quantizer 205. The signal processing module 213 is used to improve the resolution of the signal output by the first D/A converter 207 and/or the second D/A converter 211. The signal processing may include the DEM processing or the ELD compensation processing.

In certain embodiments, the loop filter 203 may be a cascaded integrators with feedback (CIFB) filter. Accordingly, the output node of the third D/A converter 211 may be coupled to an intermediate node of the loop filter 203. The term "intermediate node" refers to a node between two neighboring integrators in an integration path consisting of multiple cascaded integrators.

Figure 6:
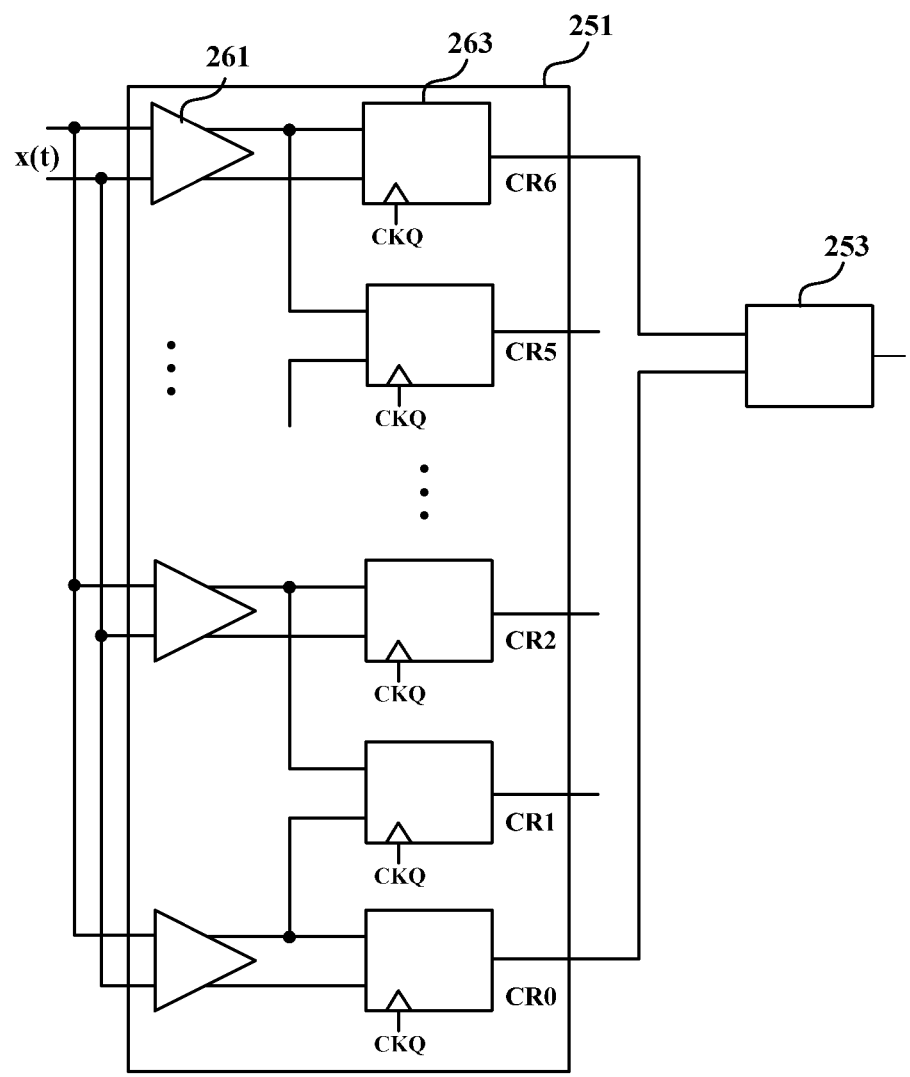
FIG. 6 illustrates an exemplary schematic of the quantizer in FIG. 4.

FIG. 6 illustrates an exemplary schematic of the quantizer in FIG. 4.

As illustrated in FIG. 6, the quantizer 205 includes a comparison circuit 251 and a processing circuit 253. The comparison circuit 251 is used to compare the inputted analog signal x(t) (i.e. the filtered difference signal x(t) shown in FIG. 4) with various reference voltages to obtain comparison results $CR_0$-$CR_n$, each of which is of a value "0" or "1". The comparison circuit 251 may be implemented with a parallel ADC circuitry having several pre-amplifiers 261 and several latches 263. The latches 263 are used to provide latched data at each rising edge of a clock signal CKQ.

For example, the quantizer in FIG. 6 uses a 3-bit parallel ADC circuitry. Thus, the thermometer code generated by the comparison circuit 251 includes seven bits $CR_6$-$CR_0$, wherein the bit $CR_6$ is the most significant bit and the bit $CR_0$ is the least significant bit. Typically, one bit of the thermometer code is set to be "1" if the input analog signal x(t) is higher than the compared reference voltage, and set to be "0" if the input analog signal x(t) is lower than the compared reference voltage. Thus, a point where one bit of the thermometer code changes from "1" to "0" is a point indicating that the amplitude of the input analog signal x(t) changes from higher than a specific reference voltage to lower than it.

As described hereinabove, the input analog signal x(t) is of its maximum or minimum amplitude when the comparison result is all—"0" or all—"1". It may be configured that the sigma-delta A/D converter is overloaded in this state. Assuming that the second D/A converter of the sigma-delta A/D converter is a 1-bit D/A converter, the processing circuit 253 may include a XNOR gate whose two input nodes are coupled to the bits $CR_6$ and $CR_0$, respectively. An output node of the XNOR gate is coupled to the input node of the second D/A converter. Specifically, when the input signal is overloaded, the overload signal output by the XNOR gate is "1", causing the second D/A converter to generate the second feedback signal of a predetermined reference value. Moreover, when the input signal is not overloaded, i.e. when the bit $CR_6$ is "0" and the bit $CR_0$ is "1", the overload signal output by the XNOR gate is "0". Then the second D/A converter outputs the second feedback signal of zero value, which does not affect the operation of the sigma-delta A/D converter. Moreover, the comparison results $CR_5$-$CR_1$ may be provided to the first D/A converter, thereby the first D/A converter may generate the first feedback signal according to the quantized signal of different values. For example, the first D/A converter may be a current mirror with multiple mirror paths capable of generating mirror currents of same amplitude. Each mirror path is controlled by a MOS switch. The bits $CR_5$-$CR_1$ are coupled to the MOS switches in different mirror paths, respectively, to control the generation of the mirror currents. In this way, the amplitude of the first feedback signal can be determined by the comparison results of the quantized signal.

It should be noted that although several modules or sub-modules of the circuit have been described in the previous paragraphs, such division is exemplary and not mandatory. Practically, according to the embodiments of the present application, the functions and features of two or more modules described above may be embodied in one module. On the other hand, the function and feature of any one module described above may be embodied in two or more modules.

While the present application has been illustrated and described in detail in the drawings and foregoing description, such illustration and description are to be considered illustrative or exemplary and not restrictive; the present application is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope. The scope and spirit of the present application is defined by the appended claims.

What is claimed is:

1. A sigma-delta ($\Sigma$-$\Delta$) analog-to-digital (A/D) converter, comprising:
    a summing stage, configured to receive an input signal and subtract a first feedback signal and a second feedback signal from the input signal to generate a difference signal;
    a loop filter coupled to an output node of the summing stage, and configured to filter the difference signal;
    a quantizer coupled to an output node of the loop filter, and configured to quantize the filtered difference signal to generate a quantized signal, and to generate an overload signal according to the filtered difference signal, wherein the overload signal indicates whether the filtered difference signal is overloaded and/or an overload amount of the filtered difference signal;
    a first digital-to-analog (D/A) converter coupled to the quantizer to receive the quantized signal, and configured to generate the first feedback signal according to the quantized signal; and
    a second D/A converter coupled to the quantizer to receive the overload signal, and configured to generate the second feedback signal according to the overload signal.

2. The sigma-delta A/D converter of claim 1, wherein the quantizer has a first output node for outputting the quantized signal, and a second output node for outputting the overload signal.

3. The sigma-delta A/D converter of claim 1, wherein the quantizer is further configured to compare the filtered difference signal and a predefined overload threshold, and generate the overload signal according to the comparison result of the filtered difference signal and the predefined overload threshold.

4. The sigma-delta A/D converter of claim 1, further comprising:
    a signal processing module, coupled between the quantizer and the first D/A converter, and configured to improve the linearity of the first feedback signal output by the first D/A converter.

5. The sigma-delta A/D converter of claim 4, the signal processing module comprises a dynamic element matching module configured to transfer a mismatch in the quantized signal out of a passband of the loop filter.

6. The sigma-delta A/D converter of claim 4, wherein the signal processing module comprises a compensation module for compensating an excess loop delay in the sigma-delta A/D converter.

7. The sigma-delta A/D converter of claim 1, wherein the second D/A converter has a linearity lower than that of the first D/A converter.

8. The sigma-delta A/D converter of claim 1, wherein the second D/A converter is a multi-level D/A converter.

9. The sigma-delta A/D converter of claim 1, wherein the loop filter comprises cascaded integrators with feedback.

10. The sigma-delta A/D converter of claim 1, wherein the loop filter is a resistor-inductor-capacitor network filter.

11. The sigma-delta A/D converter of claim 1, further comprising:
    a third D/A converter coupled to the quantizer to receive the quantized signal, and configured to generate a third feedback signal according to the quantized signal, and output the third feedback signal to an output node or an intermediate node of the loop filter.

12. The sigma-delta A/D converter of claim 1, wherein the sigma-delta A/D converter is a continuous time sigma-delta A/D converter.

* * * * *